US008022744B2

(12) United States Patent
Lalithambika et al.

(10) Patent No.: US 8,022,744 B2
(45) Date of Patent: Sep. 20, 2011

(54) SIGNAL GENERATOR

(75) Inventors: Vinod A. Lalithambika, Cambridge (GB); David M. Garner, London (GB)

(73) Assignee: Cambridge Semiconductor Limited (GB)

( * ) Notice: Subject to any disclaimer, the term of this patent is extended or adjusted under 35 U.S.C. 154(b) by 0 days.

(21) Appl. No.: 12/244,900

(22) Filed: Oct. 3, 2008

(65) Prior Publication Data

US 2010/0085115 A1 Apr. 8, 2010

(51) Int. Cl.
*H03K 3/00* (2006.01)

(52) U.S. Cl. ........................................ 327/291; 327/543

(58) Field of Classification Search ......................... None
See application file for complete search history.

(56) References Cited

U.S. PATENT DOCUMENTS

| | | | | |
|---|---|---|---|---|
| 4,843,265 | A | 6/1989 | Jiang | |
| 5,070,311 | A | 12/1991 | Nicolai | |
| 6,091,286 | A | 7/2000 | Blauschild | |
| 6,150,872 | A * | 11/2000 | McNeill et al. | 327/539 |
| 6,157,270 | A | 12/2000 | Tso | |
| 6,496,056 | B1 | 12/2002 | Shoji | |
| 2006/0226922 | A1 | 10/2006 | Rajagopal et al. | |
| 2008/0111617 | A1 * | 5/2008 | Krishna | 327/543 |

OTHER PUBLICATIONS

Sundaresan, K., et al., "A 7-MHz Process, Temperature and Supply Compensated Clock Oscillator in 0.25μm CMOS", *Proceedings of the 2003 International Symposium on Circuits and Systems* (*ISCAS '03*), vol. 1, (2003), I-693 - I-696.

* cited by examiner

*Primary Examiner* — Lincoln Donovan
*Assistant Examiner* — Khareem E Almo
(74) *Attorney, Agent, or Firm* — Schwegman, Lundberg & Woessner, P.A.

(57) ABSTRACT

Embodiments include a signal generator circuit for generating a time-varying signal, comprising capacitive element; FET to supply to or from the capacitive element a current matched to the FET drain current; a bias voltage generator to provide a bias voltage to the FET gate, wherein: the capacitances per unit area of the capacitive element and the FET gate are matched; the bias voltage is substantially equal to a sum of a first voltage substantially proportional to a reference voltage and a second voltage substantially proportional to temperature; the FET source-gate voltage substantially equal to the sum of the bias voltage and the gate threshold voltage, the bias voltage and a further voltage approximately equal to the gate threshold voltage summed to determine the FET source-gate voltage, the circuit to control a time period of the time-varying signal dependent on the current supply.

23 Claims, 5 Drawing Sheets

SIGNAL GENERATOR

FIELD OF THE INVENTION

The present invention generally relates to a signal generator circuit, a clock signal generator and a ramp signal generator, an apparatus and a method for generating a signal, an apparatus and a method for generating a clock signal and an apparatus and a method for generating a ramp signal, and to an apparatus and a method of trimming the temperature coefficient of a signal.

The invention is applicable to clock or ramp generators such as relaxation oscillators.

BACKGROUND TO THE INVENTION

Integrated Circuits (IC) frequently require an on-chip ramp or clock generator. It is desirable for the clock or ramp signal to be independent of process variations, supply voltage and temperature.

Many ICs use a relaxation oscillator for generation of a ramp or clock. Usually the timing elements used by this circuit are a resistor and capacitor. Each of these components varies by +/−20%, to at least some extent due to process corner. This results in the on-chip clock varying by +/−28%. To reduce the spread in clock variation with process corner it is desirable to compensate for process variations.

The use of trimming to reduce variation in the frequency of a clock may add to the cost of ICs that require an on-chip ramp or clock generator.

U.S. Pat. No. 6,091,286 (Philips Electronics North America Corporation, Jul. 18, 2000) describes an integrated reference circuit having controlled temperature dependence. Specifically, the patent describes that mobility in an FET is used as a time standard to develop a reference component which may be fully integrated and which is temperature stable to an arbitrary desired accuracy. The large temperature dependence of mobility is compensated by applying a gate bias voltage having a predetermined variation in value with respect to temperature. In one embodiment the bias voltage of the FET is given a temperature dependence which results in the drain current of the FET being substantially constant with respect to temperature. This current is then used to charge or discharge a capacitor, yielding an R-C product which may be implemented in integrated form. A plurality of PTAT current sources are combined, and FET threshold bias compensation is provided by a bias source that is separate from the temperature dependent current sources.

U.S. Pat. No. 4,843,265 (Dallas Semiconductor Corporation, Jun. 27, 1989) describes that a temperature and processing compensated time delay circuit of the type which can be fabricated in a monolithic integrated circuit utilizes a field effect transistor (FET) connected to the terminals of a charged capacitor. A bias voltage connected to the gate of the FET varies with temperature in a manner to compensate for the changes in current which flows from the capacitor through the FET due to changes in temperature. The bias voltage also varies from one integrated circuit to another in a manner to compensate for variations in FET threshold voltage caused by variations in the processing of the integrated circuits.

The negative temperature co-efficient in the bias voltage is provided by three summed BJT base-emitter voltages in combination with a scaled and temperature invariant bandgap voltage. Hence, it cannot be arbitrarily scaled. Furthermore, the FET threshold compensation is provided by a second FET that does not have its source at the same potential as that of the first FET. Hence, threshold voltage cancellation is not perfect. Furthermore, a timing capacitor is connected across the drain-source terminals of the FET.

U.S. Pat. No. 6,157,270 (Exar Corporation, Dec. 5, 2000) relates to a programmable oscillator, and describes that an oscillator circuit generates an output frequency that is substantially independent of power supply and temperature variations. The oscillator circuit can be implemented using conventional complementary metal-oxide-semiconductor technology. A FET is used in linear mode.

U.S. Pat. No. 6,496,056 (Agere Systems Inc, Dec. 17, 2002) relates to process tolerant integrated chip design. It describes that an operating parameter of an integrated circuit is made substantially insensitive to process variations by configuring the circuit such that an environmental parameter, e.g., supply voltage to a portion of the circuit, is made a function of one or more process parameters, e.g., conduction threshold voltages and mobilities in that portion of the circuit. In an arrangement, the circuit operating parameter is an oscillation period of a ring oscillator. A voltage regulator generates a reference voltage which is determined at least in part based on known process parameter variations in the ring oscillator. The ring oscillator utilizes the reference voltage generated by the voltage regulator as its supply voltage.

US patent application 2006/0226922 A1 (Texas Instruments Inc, published Oct. 12, 2006) relates to a process, supply, and temperature insensitive integrated time reference circuit. Specifically, it describes that a relaxation oscillator includes a reference voltage circuit configured to maintain a reference voltage in proportion to actual circuit resistance values. A charging current is proportional to 1/R.

U.S. Pat. No. 5,070,311 (SGS-Thomson Microelectronics SA, Dec. 3, 1991) relates to an integrated circuit with adjustable oscillator with frequency independent of the supply voltage. Specifically, it describes that, to enable the making, in an integrated circuit, of an internal clock, the frequency of which is adjustable and does not depend on the general supply voltage Vcc of the circuit, a relaxation oscillator is used. The relaxation oscillator is built in the following way: weighted individual current sources may be selectively connected in parallel under the control of a register containing frequency adjusting data. These sources charge and discharge a capacitor. A threshold comparator determines a high threshold Vh and a low threshold Vb to trigger respectively the discharging and the charging of the capacitor. The difference Vh-Vb is made proportional to the currents of the elementary sources. A discrete charging capacitor is used.

Paper "A 7-MHz process, temperature and supply compensated clock oscillator in 0.25 μm CMOS" (Sundaresan, K.; Brouse, K. C.; U-Yen, K.; Ayazi, F.; Allen, P. E., ISCAS 03: Proceedings of the 2003 International Symposium on Circuits and Systems, 2003; Volume 1, May 25-28, 2003, Page (s): I-693-I-696) relates to the design and characterization of a process, temperature and supply compensation technique for a clock generator based on a three-stage differential ring oscillator. The variation of the frequency of the oscillator with temperature and process is discussed and an adaptive biasing scheme incorporating a unique combination of a process corner sensing scheme and a temperature compensating network is considered. Specifically, the paper describes that a biasing circuit changes the control voltage of the differential ring oscillator to maintain a constant frequency. The technique includes a process corner sensing scheme.

In the field of signal generation, it is desirable to provide cost-effective generation of a clock or ramp signal that is independent of process variations, supply voltage and temperature. Moreover, there is a need to provide apparatuses and methods for improved signal generation, and apparatuses and methods for improved trimming of the temperature coefficient of a signal.

SUMMARY

According to a first aspect of the present invention, there is provided a signal generator circuit, comprising: a capacitive element; a first field effect transistor (FET) having a gate, a drain and a source, arranged to generate current through the drain and to supply to or from the capacitive element a current substantially equal to said current through the drain; and a bias voltage generator arranged to provide a bias voltage to the gate of the first FET, wherein: the capacitance per unit area of the capacitive element and the capacitance per unit area of the gate of the first FET are substantially equal; the bias voltage generator comprises a first voltage generator and a second voltage generator and is arranged to generate a bias voltage substantially equal to a sum of the first voltage and the second voltage; said first voltage is arranged to be substantially proportional to a reference voltage; said second voltage is arranged to be substantially proportional to temperature; and the voltage between the source and gate of the first FET is arranged to be substantially equal to the sum of the bias voltage and a gate threshold voltage of the first FET.

In embodiments, the above-described circuit may advantageously enable provision of an on-chip process, voltage and temperature compensated clock. Specifically, the timing or frequency of a ramp or clock generator using the above described circuit may be process, voltage and temperature compensated.

It is particularly advantageous if the first FET is a metal-oxide-semiconductor FET (MOSFET), wherein the gate capacitance is determined by process parameters employed in fabricating the gate insulation, e.g., thickness of SiO2, which may be determined for example by time and/or power of RF sputtering.

In this regard, a second FET may be provided as the capacitive element in the above signal generator circuit. In this case, the second FET may have the drain connected to the source, the said supply of current being to or from the gate of the second FET. Thus, the capacitive element may advantageously be fabricated conveniently by means of some of the same process steps as the first FET. For example, both the first and second FETs may be MOSFETs fabricated at the same time.

Regarding the reference voltage, this may in embodiments be, for example, a bandgap voltage or a pn junction threshold voltage (e.g., a voltage across a forward biased pn junction diode).

The second voltage generator may comprise a Proportional To Absolute Temperature current generator.

The above signal generator circuit may further comprise current mirror circuitry arranged to generate the current supplied to or from the capacitive element by mirroring the current through the drain of the first FET. One advantage of such an arrangement may be that the signal generator circuit will operate over a wider range of supply voltage.

There may yet further be provided the above signal generator circuit, wherein the first FET and the capacitive element are integral to a single substrate. In this case, it is possible to fabricate at least the dielectric of the capacitive element and the dielectric of the gate capacitance of the first FET using the same process step(s), e.g. RF sputtering, or ion deposition followed by oxidation.

Advantageously, the capacitance per unit area of the capacitive element and of the gate capacitance of the first FET may then be substantially matched. This is particularly convenient where the capacitive element is provided as a gate capacitance of a second FET, for example where the first and second FETs are both MOSFETs.

Furthermore, there may be provided the above signal generator circuit, wherein: said first voltage is substantially proportional to said reference voltage according to a first constant of proportionality; said second voltage is substantially proportional to temperature according to a second constant of proportionality; and the signal generator circuit is arranged so that at least one of said first and second constants of proportionality is adjustable.

For example, each constant of proportionality may be adjustable by means of a respective resistive potentiometer that may be programmable, e.g., by analogue or digital control. Such control may be achieved through automatic feedback control, using a microprocessor.

Alternatively, such adjustment may be achieved by determining appropriate fabrication process parameters of a voltage divider(s) (e.g., resistive voltage divider(s)) according to the desired constant(s) of proportionality. Where a constant of proportionality is substantially equal to one, adjustment for this value may be achieved by appropriate design of the circuit configuration and corresponding fabrication process so that no divider is required.

In this manner, embodiments may allow the temperature coefficient of a signal to be minimised. Alternatively, it may be advantageous in some applications to maximise the temperature coefficient, or to set the temperature coefficient to a specific predetermined value, by using the above adjustment of constant(s) of proportionality.

According to a second aspect of the present invention, there is provided a clock signal generator comprising the above signal generator circuit, further comprising a resistive element, wherein the resistive element and the capacitive element are arranged to determine timing of a clock signal.

According to a third aspect of the present invention, there is provided a ramp signal generator comprising the above signal generator circuit, arranged to vary the ramp signal with time in dependence on voltage on the capacitive element.

In the above aspects, the rate of change of voltage of the signal, such as the clock or ramp signal, may be determined by an RC time constant of the resistive and capacitive elements. In this case, the signal voltage may be the voltage on one electrode of the capacitive element, which is charged and/or discharged through the resistive element.

According to a fourth aspect of the present invention, there is provided a timer comprising the above signal generator circuit, further comprising: a second capacitive element arranged to control said supply of current to or from the first capacitive element, in dependence on the voltage on said second capacitive element; a first switch arranged to enable a current substantially equal to the drain current of the first FET to charge the second capacitive element; a second switch arranged to reset the voltage on the gate of the first FET; a third switch arranged to enable a current substantially equal to the drain current of the first FET to charge the gate capacitance of the first FET; and a comparator arranged to reset the voltage on the gate of the first FET when the voltage on the gate of the first FET is substantially equal to a reference voltage.

An embodiment of such a timer may allow more accurate timing of a period, e.g., a period between a start and a stop signal, or a period of a ramp.

According to a fifth aspect of the present invention, there is provided a method of generating a signal comprising: generating current through the drain of a first FET having a gate, a drain and a source; supplying to or from a capacitive element a current substantially equal to said current through the drain; providing a bias voltage to the gate of the first FET; generating the bias voltage substantially equal to a sum of a first voltage and a second voltage, the first voltage being substantially proportional to a reference voltage and the second voltage being substantially proportional to temperature; and controlling the voltage between the source and gate of the first FET to be substantially equal to the sum of the bias voltage and a gate threshold voltage of the first FET, wherein the capacitance per unit area of the capacitive element and the capacitance per unit area of the gate of the first FET are substantially equal.

In the above method, the first FET may be operated in active mode, i.e., in the active region where the drain-source current of the transistor is substantially proportional to mobility, gate capacitance per unit area and to the square of Vgs-Vt, where Vgs is the gate source voltage and Vt is the threshold voltage.

Furthermore, the above method of generating a signal may further comprise fabricating the capacitive element and the first FET on a single substrate. In this way, the capacitance per unit area of the capacitive element and the first FET may conveniently be made substantially equal by fabricating the dielectric of the capacitor and the gate oxide of the first FET by means of the same process step, e.g., ion deposition or RF sputtering.

The above method may further comprise: controlling said supply of current to or from the first capacitive element, in dependence on the voltage on a second capacitive element; during a first time interval, charging the second capacitive element with a current substantially equal to the drain current of the first FET; during a second time interval, resetting the voltage on the gate of the first FET; during a third time interval, charging the gate capacitance of the first FET with a current substantially equal to the drain current of the first FET; and resetting the voltage on the gate of the first FET when the voltage on the gate of the first FET is substantially equal to a reference voltage.

According to a sixth aspect of the present invention, there is provided a clock signal generation method comprising the above method of generating a signal, and further comprising determining timing of a clock signal in dependence on a current, which flows through a resistive element and to or from the capacitive element.

According to a seventh aspect of the present invention, there is provided a ramp signal generation method comprising the above method of generating a signal, and further comprising varying the ramp signal with time in dependence on voltage on the capacitive element.

According to an eighth aspect of the present invention, there is provided a method of trimming the temperature coefficient of a signal comprising the above method of generating a signal, wherein: said first voltage is substantially proportional to said reference voltage according to a first constant of proportionality; and said second voltage is substantially proportional to temperature according to a second constant of proportionality, further comprising: adjusting at least one of said first and second constants of proportionality.

Thus, the temperature coefficient (TC) of the clock or ramp generator may advantageously be trimmed to achieve a specific desired temperature dependence of the generated signal.

According to a ninth aspect of the present invention, there is provided an apparatus for generating a signal, comprising: means for generating a current through the drain of a first FET having a gate, a drain and a source; means for supplying to or from a capacitive element a current substantially equal to said current through the drain; and means for providing a bias voltage to the gate of the first FET; means for generating the bias voltage substantially equal to a sum of a first voltage and a second voltage, the first voltage being substantially proportional to a reference voltage and the second voltage being substantially proportional to temperature; and means for controlling the voltage between the source and gate of the first FET to be substantially equal to the sum of the bias voltage and a gate threshold voltage of the first FET, wherein the capacitance per unit area of the capacitive element and the capacitance per unit area of the gate of the first FET are substantially equal.

According to a tenth aspect of the present invention, there is provided an apparatus for generating a clock signal, comprising the above apparatus for generating a signal and further comprising means for determining timing of a clock signal in dependence on a current, which flows through a resistive element and to or from the capacitive element.

According to an eleventh aspect of the present invention, there is provided an apparatus for generating a ramp signal, comprising the above apparatus for generating a signal and further comprising means for varying the ramp signal with time in dependence on voltage on the capacitive element.

According to a twelfth aspect of the present invention, there is provided an apparatus for trimming the temperature coefficient of a signal comprising the above apparatus for generating a signal, and further comprising: means for performing said generating the first voltage that is substantially proportional to said reference voltage according to a first constant of proportionality; means for performing said generating the second voltage that is substantially proportional to temperature according to a second constant of proportionality; and means for adjusting at least one of said first and second constants of proportionality.

According to a thirteenth aspect of the present invention, there is provided the above apparatus for generating a signal, further comprising: means for controlling said supply of current to or from the first capacitive element, in dependence on the voltage on a second capacitive element; means for charging the second capacitive element, during a first time interval, with a current substantially equal to the drain current of the first FET; means for resetting the voltage on the gate of the first FET during a second time interval; means for charging the gate capacitance of the first FET, during a third time interval, with a current substantially equal to the drain current of the first FET; and means for resetting the voltage on the gate of the first FET when the voltage on the gate of the first FET is substantially equal to a reference voltage.

BRIEF DESCRIPTION OF THE DRAWINGS

For a better understanding of the invention and to show how the same may be carried into effect, reference will now be made, by way of example, to the accompanying drawings, in which.

DETAILED DESCRIPTION OF PREFERRED EMBODIMENTS

The following describes theory underlying the invention.

Figure 1:
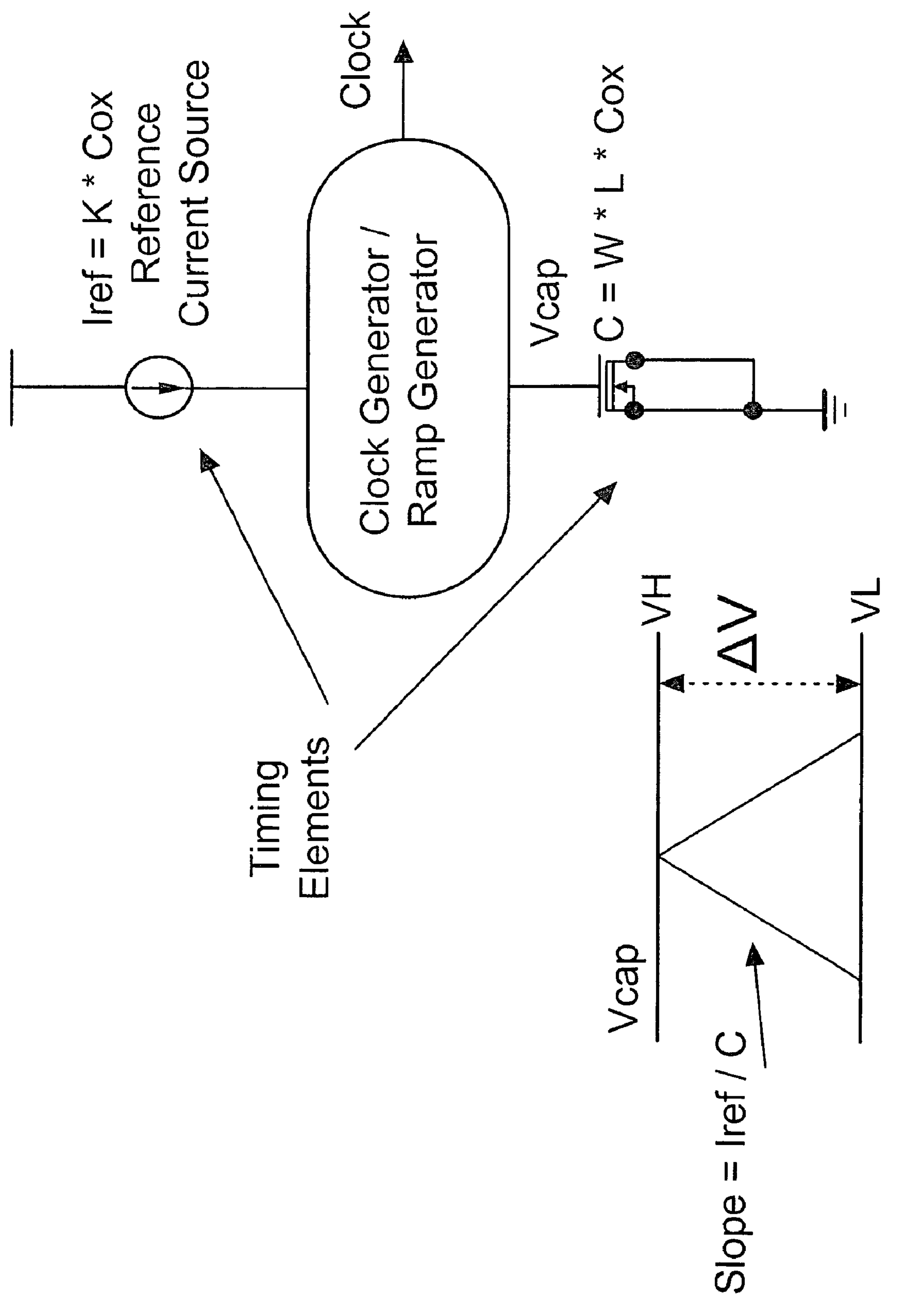
FIG. 1 is a block diagram of a clock or ramp generator.

FIG. 1 shows the simplified block diagram for generation of an on-chip clock (or ramp). The topology used is a relaxation oscillator that uses two timing elements: a current source and a capacitor. The capacitor is charged and discharged by this current source. The rate at which the capacitor voltage changes (i.e., the slope) is given by Equation 1, where, Iref is the magnitude of the charging and discharging current and C is the magnitude of the capacitance:

$$\text{Slope} = \frac{dV}{dt} = \frac{I_{ref}}{C} \qquad \text{Equation 1}$$

The capacitance may be the gate capacitance of a MOS transistor. For a fully inverted MOS transistor, the gate capacitance is given by Equation 2, where W is the width and L is the length of the gate oxide respectively and Cox is the capacitance per unit area of a MOS transistor:

$$C = WLC_{ox} \qquad \text{Equation 2}$$

Note that W and L are made large enough such that perimeter capacitance of the poly gate can be ignored.

From Equations 1 and 2, the slope is given by Equation 3:

$$\text{Slope} = \frac{I_{ref}}{WLC_{ox}} \qquad \text{Equation 3}$$

If the current source has a magnitude that is proportional to the gate capacitance (Iref=K*Cox), the slope is then given by Equation 4:

$$\text{Slope} = \frac{K}{WL} \qquad \text{Equation 4}$$

Thus, the slope and hence the timing/frequency of the ramp/clock generator may become independent of process variation and may only depend on the geometry of the MOS transistor.

A current (I) proportional to Cox may be generated using a MOS transistor in the active region as given by Equation 5, where Vgs is the gate source voltage (bias voltage), Vt is the threshold voltage and μ is the mobility:

$$I = \frac{\mu C_{ox} W}{2L}(V_{gs} - V_t)^2 \qquad \text{Equation 5}$$

However, this current does vary with process corner because of the variation of the threshold voltage Vt with process corner. To eliminate the variation because of Vt, the bias voltage Vgs can be made dependent on Vt, as given by Equation 6:

$$V_{gs} = V_{bias} + V_t \qquad \text{Equation 6}$$

From Equations 5 and 6, the current I is given by Equation 7:

$$I = \frac{\mu C_{ox} W}{2L}(V_{bias})^2 \qquad \text{Equation 7}$$

Thus, process corner may be substantially taken out of the equations governing the rate of charge of, e.g., a timing capacitance. Therefore, there may advantageously be no need to sense process corner.

The mobility of a MOS transistor depends on temperature and is given by Equation 8:

$$\mu = \mu_o T^{-3/2} \qquad \text{Equation 8}$$

Substituting Equation 8 in Equation 7, the current is given by Equation 9:

$$I = \frac{\mu_o T^{-3/2} C_{ox} W}{2L}(V_{bias})^2 \qquad \text{Equation 9}$$

Equation 9 shows that the current is a function of temperature, since the mobility is a function of temperature. To reduce the variation of the current with temperatures Vbias can be chosen to be a voltage given by Equation 10, where Vref is either a bandgap voltage reference or a voltage across a forward biased diode (Vbe) and Kptat and Kref are constants (or scaling factors):

$$V_{bias} = K_{ref} V_{ref} + K_{ptat} T \qquad \text{Equation 10}$$

Substituting in Equation 9, the current is given by Equation 11, where μ0, Cox, W and L are all constants:

$$\begin{aligned} I &= I_{ref} \qquad \text{Equation 11} \\ &= \frac{\mu_o T^{-3/2} C_{ox} W}{2L}(K_{ref} V_{ref} + K_{ptat} T)^2 \\ &= \frac{\mu_o C_{ox} W}{2L}\begin{pmatrix} K_{ref}^2 V_{ref}^2 T^{-3/2} + \\ 2K_{ref} K_{ptat} V_{ref} T^{-1/2} + \\ K_{ptat}^2 T^{1/2} \end{pmatrix} \end{aligned}$$

Equation 11 shows that the reference current (Iref) variation with temperature may be significantly reduced by adjusting the values of Kptat and/or Kref. However, the use of Vref or a scaled value of Vref is optional since when Kref=0, Equation 11 shows that Iref varies with $T^{1/2}$– a relatively weak dependence. Thus, embodiments implemented in line with the above theory may advantageously provide to/from a capacitive element a charging/discharging current that is constant with respect to a resistance R. This may be achieved using, in an embodiment, a single PTAT+threshold bias source.

Embodiments of methods and apparatuses implemented in line with the above theory have provided a low cost method of generating an on-chip clock that is process, voltage and temperature compensated. In particular, the use of a FET in saturation mode may result in superior performance. A conventional on-chip relaxation oscillator using a resistor and capacitor (each of them typically varies by +/−20%) may give an accuracy of +/−28% (3σ). However, simulation and production silicon of embodiments of the invention has shown that, by implementing the above theory, the accuracy may be increased to +/−7.5% (3σ).

Figure 2:
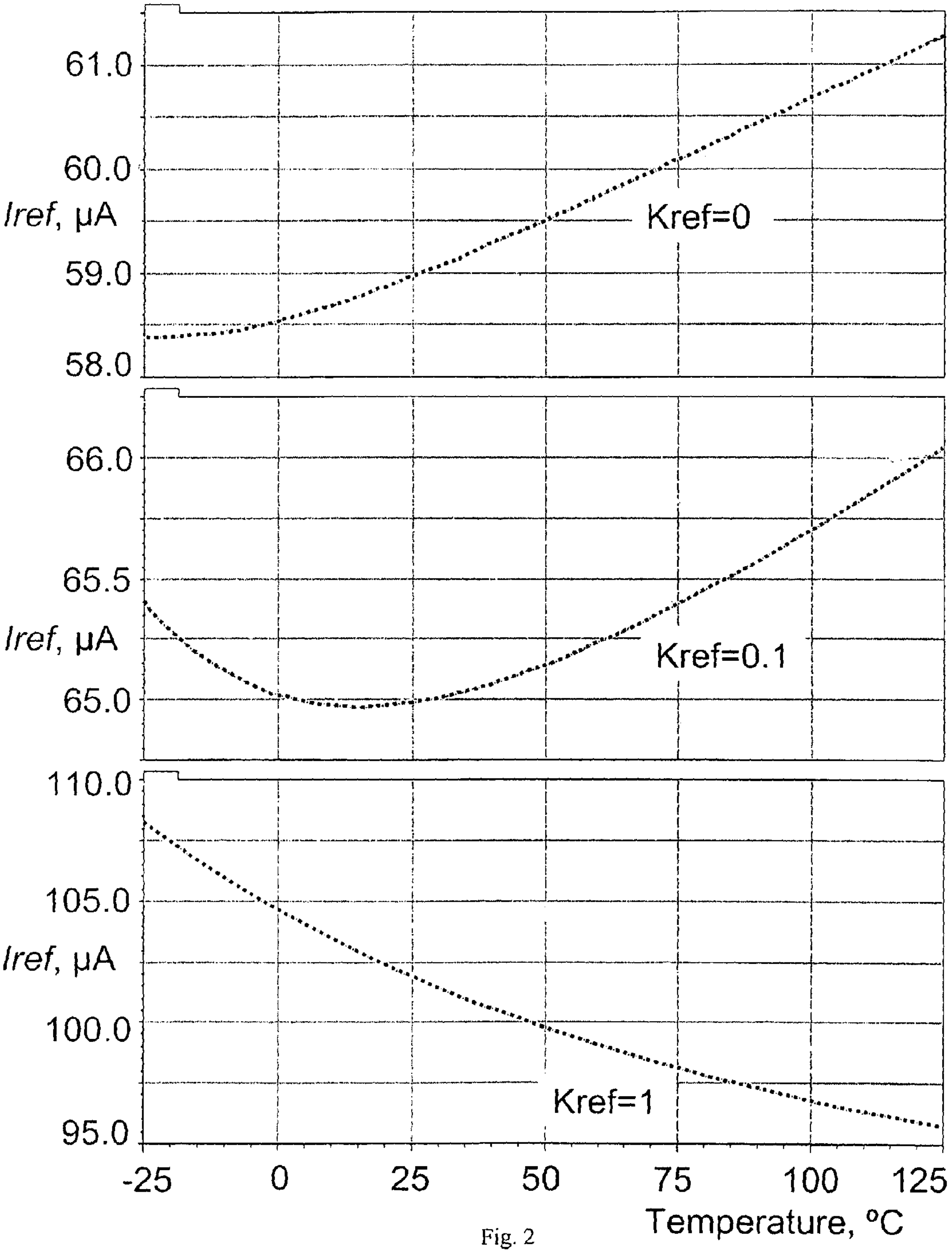
FIG. 2 is a graph showing variation in the temperature coefficient (TC) of the reference current with different values of scaling factor Kref.

Further regarding Equation 11, FIG. 2 is a simulation result that shows how the temperature co-efficient of the reference current varies with variation of Kref. As shown in Equation 11, the current generated may be independent of the supply voltage variations, and proportional to Cox. By properly choosing the value of Kref, the reference current Iref may be compensated for temperature variations. Also, for the value of Kref=0, the variation of the bias current with temperature from −25° C. to 125° C. is only 4.8%. This shows that the use of Vref or scaled factor of Vref is optional (see Equation 10). Variation of the scaling factor Kref and/or KPTAT provide a means for trimming the temperature co-efficient of the reference current. The magnitude of the reference current may be varied by varying the size (W and/or L) of the MOSFET.

The following describes a system embodiment in overview.

Figure 3:
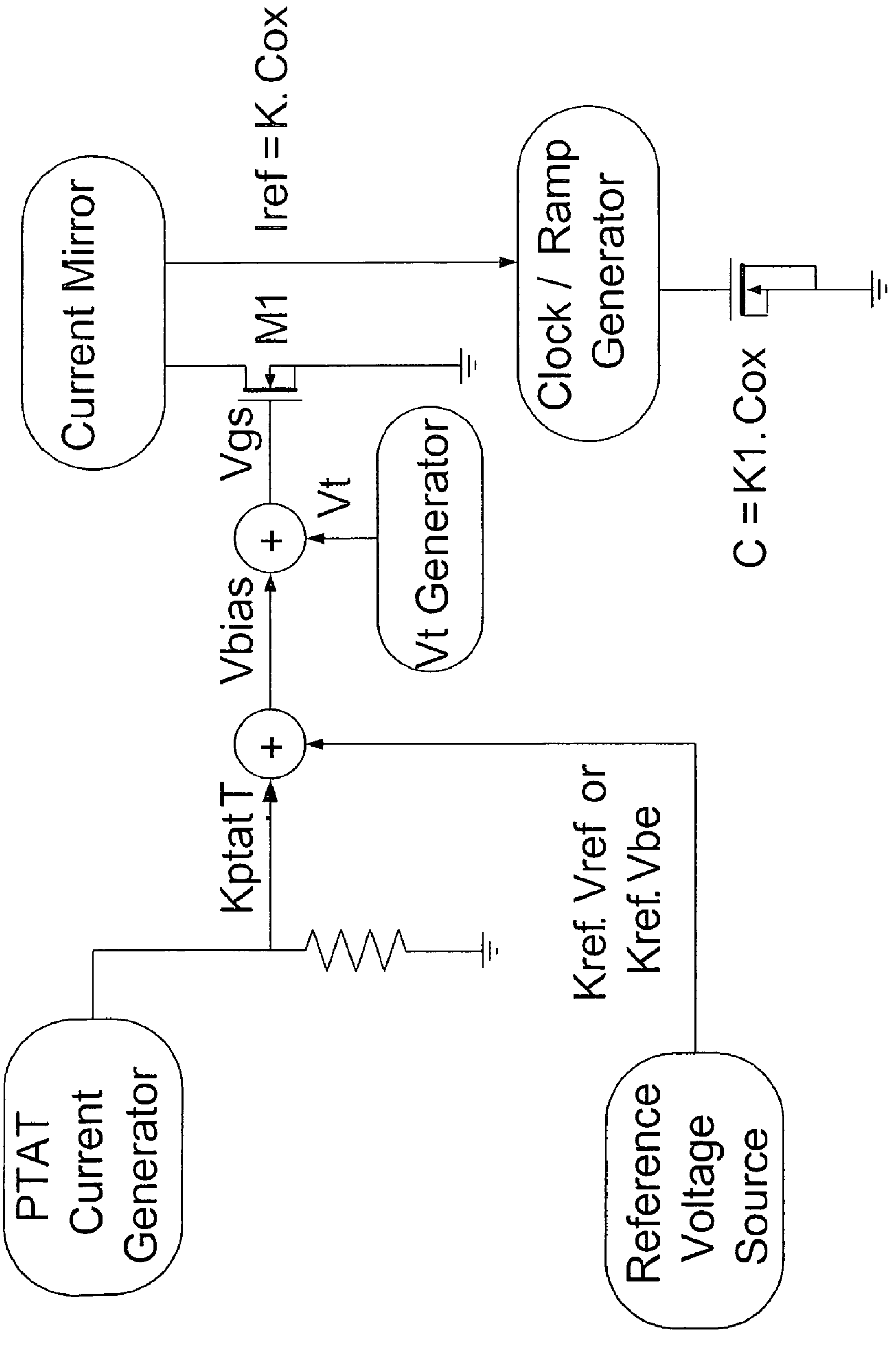
FIG. 3 is a block diagram of an embodiment of a clock or ramp generator, which may be process, voltage and temperature compensated.

As shown in FIG. 3, the required bias voltage (Equation 10) is generated using a PTAT current generator and a reference voltage source (Vref or Vbe). The transistor M1 generates a current that is compensated for voltage and temperature. This current is proportional to Cox the gate oxide capacitance. The clock/ramp generator may use this current and a capacitance proportional to Cox as the timing elements to create a process, voltage and temperature independent clock, ramp or timing generator.

Figure 4:
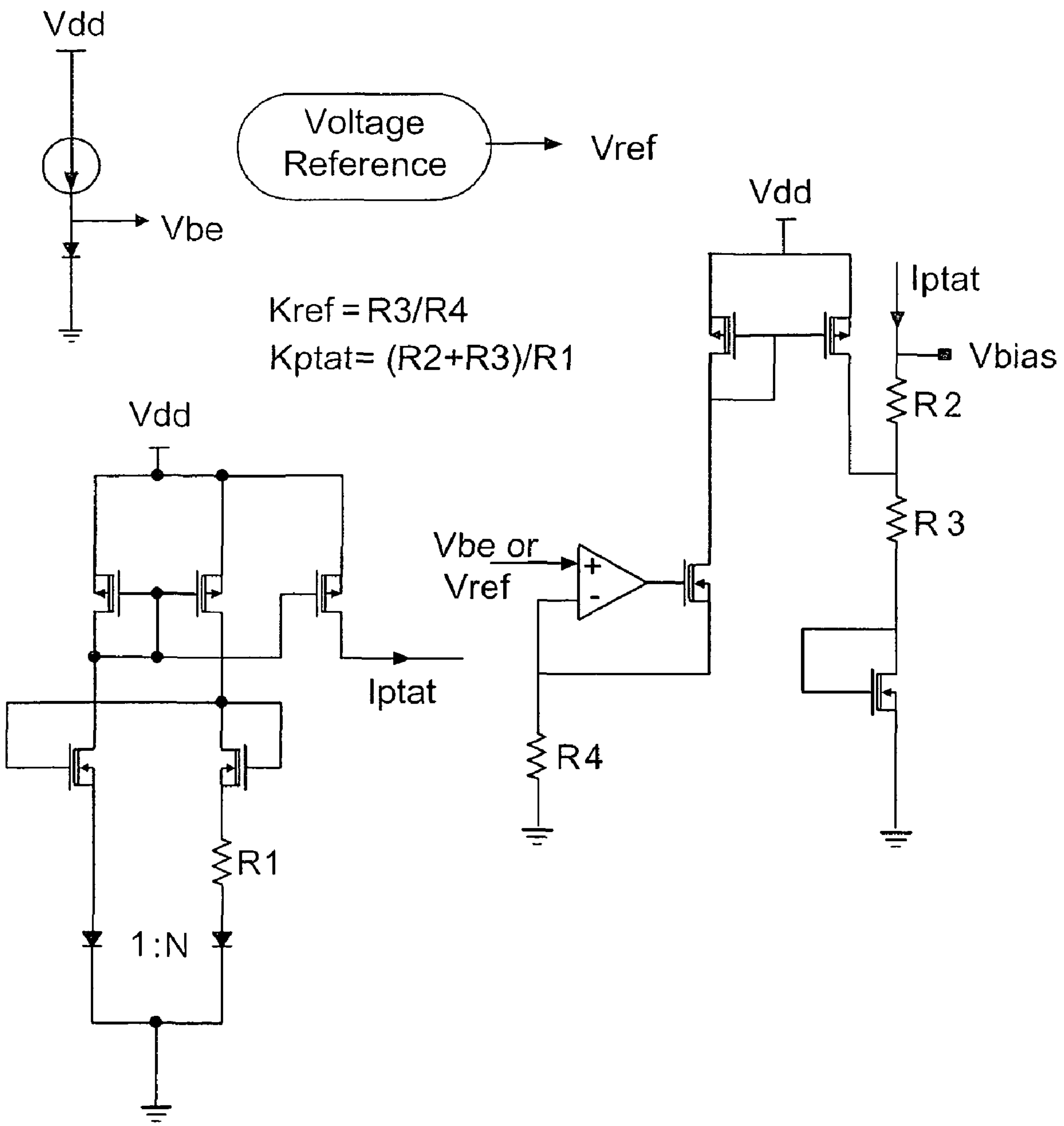
FIG. 4 shows use of a PTAT current source in an embodiment of a signal generator.

Regarding for example a Proportional to Absolute Temperature (PTAT) current generator and bias generator, the gate source voltage for the transistor M1 as given by Equation 6 and Equation 10 may be generated using the circuit shown in FIG. 4. The value of Kptat may be adjusted by changing R2 and/or R1. The value of Kref may be adjusted by changing R4. By adjusting the values of these resistances, the variation of reference current (Iref) with temperature, and hence of the variation of frequency with temperature, may be significantly reduced.

In view of the above, and regarding a Process, Voltage and Temperature (PVT) compensated timer, FIG. 3 shows that two separate MOSFETS may be used for generating a ramp/timer. A reference current proportional to Cox) is generated by one MOSFET and another MOSFET is used as a capacitor, the capacitance of which is proportional to Cox. Here, Cox is the capacitance of the gate of a MOSFET.

However, variations in the oxide capacitances of these MOSFETS due to mismatches may result in variations in the timing/frequency of the ramp/clock generator. Specifically, the scheme shown in FIG. 3 uses two MOSFETs, one for generating a current proportional to gate oxide capacitance and the other MOSFET that is used as a timing capacitor. However the mismatch between the gate oxide capacitances of these two MOSFETS may result in the period of ramp being correlated to the mismatch between these two gate oxide capacitances. To remove this correlation, a method has been developed that uses a single MOSFET both as timing element and for generation of a reference current.

If a single MOSFET is used for generating the reference current, and if the gate capacitance of the same MOSFET is used for the timing element of the ramp generator, then the variation of the timing of the ramp generator due to variation in the oxide capacitance may be avoided. A ramp/timing generator circuit which uses only a single MOSFET as described above is shown in FIG. 5, and operation of the circuit of FIG. 5 is described below.

During the ‘sample’ signal, the capacitance M4 is set to the voltage required for maintaining the current Iref in a capacitive element e.g., the MOSFET M3. A voltage Vbias given by Equation 10 applied to the MOSFET M1 sets the value of the reference current Iref, that may be independent of voltage, proportional to the gate capacitance of M1 and significantly compensated for temperature. It is noted that this reference current may be scaled by changing the size ratio of the current mirror M2/M3.

During the ‘start’ signal, the gate of the MOSFET M1 is reset to a known voltage, zero in this case.

Figure 5:
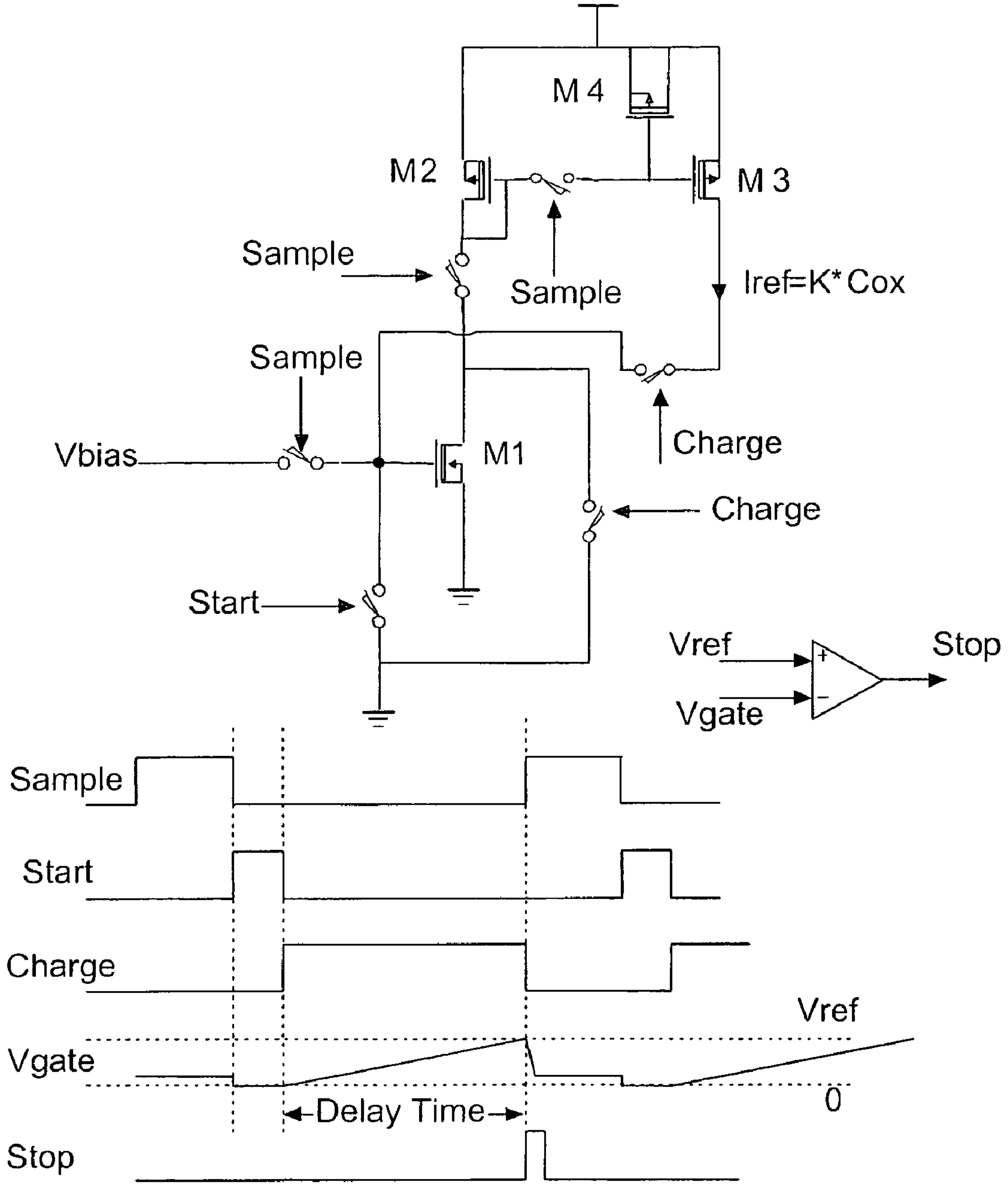
FIG. 5 illustrates a method of generating a delay time using a single MOSFET that acts as both a current source and a capacitor, wherein the delay time may be independent of PVT (Process, Voltage, Temperature).

During the ‘charge’ period, the reference current is routed to the gate of the MOSFET and the voltage at the gate increases at a linear rate as shown in FIG. 5. A comparator compares this gate voltage to reference voltage Vref (e.g., a bandgap voltage), which may or may not be equal to the reference voltage Vref used in the bias generator circuit shown in FIG. 3 or 4 and introduced in Equation 10.

When the ramp voltage crosses the threshold voltage, a ‘stop’ signal is generated which resets the ramp and the whole cycle starts again.

When the circuit of FIG. 5 is operated as described above, the delay time from the falling edge of the ‘start’ signal to the start of the ‘stop’ signal (or the period of the ramp) may be independent of process, voltage and temperature.

This approach, whilst perhaps less suitable for application as a continuous clock due to the undefined ‘sample’ and ‘start’ signal durations, may be more appropriate for providing an accurate delay.

In view of the above, embodiments of the invention may implement concepts of: (a) generating a FET bias voltage that compensates for changes in the drain current that are caused by the effects of temperature on carrier mobility; (b) compensating for process variations by removal of the threshold voltage term; (c) using a timing capacitor having the same capacitance per unit area as the FET’s gate oxide. The combination of (a)-(c) may provide the basis for a process and temperature-compensated clock.

Embodiments of the invention may provide an apparatus or method for generation of a process, voltage and temperature compensated clock or ramp generator. The timing elements in a ramp generator (or clock generator) may be a current source (Iref) and a capacitor (C). The capacitor may be the gate capacitance of a MOS transistor (C=ACox; where A is the area of the gate and Cox is the capacitance per unit area). If the current source has a magnitude that is proportional to the gate capacitance (Iref=K Cox) then process variation of the timing, frequency of a ramp/clock generator may be compensated for. Furthermore, if that current source is temperature and supply independent, the frequency of the clock may also be independent of temperature and supply voltage.

Furthermore, if in an embodiment a single MOSFET is used both for generating the reference current and as a timing element, the variation of the timing of a signal (e.g., clock or ramp) due to variation in, e.g., oxide capacitance, may be avoided.

Further still, many other effective alternatives will no doubt occur to the skilled person. It will be understood that the invention is not limited to the described embodiments and encompasses modifications apparent to those skilled in the art lying within the spirit and scope of the claims appended hereto.

The invention claimed is:

1. A signal generator circuit for generating a time-varying signal, comprising:

a capacitance;

a first field effect transistor having a gate, a drain and a source, arranged to generate current through the drain and such that a current matched to said current through the drain is supplied to or from the capacitance; and a bias voltage generator arranged to provide a bias voltage to the gate of the first field effect transistor, wherein:

the capacitance per unit area of the capacitance and the capacitance per unit area of the gate of the first field effect transistor are matched;

the bias voltage generator comprises a first voltage generator and a second voltage generator and is arranged to generate a bias voltage at least approximately equal to a sum of the first voltage and the second voltage;

said first voltage is arranged to be at least approximately proportional to a reference voltage;

said second voltage is arranged to be at least approximately proportional to temperature; and the voltage between the source and gate of the first field effect transistor is arranged to be at least approximately equal to the sum of the bias voltage and a gate threshold voltage of the first field effect transistor, the signal generator circuit arranged to sum the bias voltage and a further voltage at least approximately equal to the gate threshold voltage to determine the voltage between the source and the gate of the first field effect transistor, wherein the signal generator circuit is arranged to control a time period of the time-varying signal dependent on the current supply to or from the capacitance.

2. The signal generator circuit according to claim 1, wherein the capacitance is a second field effect transistor having a gate, a drain and a source, wherein the drain is connected to the source and said supply of current is to or from the gate of the second field effect transistor.

3. The signal generator circuit according to claim 1, wherein the reference voltage is a bandgap voltage.

4. The signal generator circuit according to claim 1, wherein the reference voltage is a pn junction threshold voltage.

5. The signal generator circuit according to claim 1, further comprising current mirror circuitry arranged to generate the current supplied to or from the capacitance by mirroring the current through the drain of the first field effect transistor.

6. The signal generator circuit according to claim 1, wherein the second voltage generator comprises a Proportional To Absolute Temperature current generator.

7. The signal generator circuit according to claim 1, wherein the first field effect transistor and the capacitance are integral to a single substrate.

8. The signal generator circuit according to claim 1, wherein:

said first voltage is at least approximately proportional to said reference voltage according to a first constant of proportionality;

said second voltage is at least approximately proportional to temperature according to a second constant of proportionality; and the signal generator circuit is arranged so that at least one of said first and second constants of proportionality is adjustable.

9. A clock signal generator comprising the signal generator circuit according to claim 1, further comprising a resistive element, wherein the resistive element and the capacitance are arranged to determine timing of a clock signal.

10. A ramp signal generator comprising the signal generator circuit according to claim 1, arranged to vary the ramp signal with time in dependence on voltage on the capacitance.

11. A timer comprising the signal generator circuit of claim 1, wherein the capacitance is a first capacitance and the gate of the first field effect transistor comprises the first capacitance, wherein the first field effect transistor having the gate, the drain and the source is arranged to generate the current through the drain in a first period and such that the current essentially equal to the current through the drain is supplied to or from the first capacitance in a further period, the timer further comprising:

a second capacitance arranged to control said supply of current to or from the first capacitance, in dependence on the voltage on said second capacitance;

a first switch arranged to enable a current at least approximately equal to the drain current of the first FET to charge the second capacitance;

a second switch arranged to reset the voltage on the gate of the first FET;

a third switch arranged to enable a current essentially equal to the drain current of the first FET to charge the gate capacitance of the first FET; and a comparator arranged to reset the voltage on the gate of the first FET when the voltage on the gate of the first FET is at least approximately equal to a reference voltage.

12. A method of generating a time-varying signal, comprising:

generating current through the drain of a first field effect transistor having a gate, a drain and a source;

supplying to or from a capacitance a current proportional to said current through the drain;

providing a bias voltage to the gate of the first field effect transistor;

generating the bias voltage at least approximately equal to a sum of a first voltage and a second voltage, the first voltage being at least approximately proportional to a reference voltage and the second voltage being at least approximately proportional to temperature; and controlling the voltage between the source and gate of the first field effect transistor to be at least approximately equal to the sum of the bias voltage and a gate threshold voltage of the first field effect transistor, by summing the bias voltage and a further voltage at least approximately equal to a gate threshold voltage of the first field effect transistor to determine the voltage between the source and gate of the first field effect transistor, wherein the capacitance per unit area of the capacitance and the capacitance per unit area of the gate of the first field effect transistor are matched, and the method comprises controlling a time period of the time-varying signal dependent on the current supply to or from the capacitance.

13. The method of generating a signal according to claim 12, further comprising operating the first field effect transistor in active mode.

14. The method of generating a signal according to claim 12, further comprising fabricating the capacitance and the first field effect transistor on a single substrate.

15. The method of claim 12, further comprising:

controlling said supply of current to or from the first capacitance, in dependence on the voltage on a second capacitance;

during a first time interval, charging the second capacitance with a current at least approximately equal to the drain current of the first FET;

during a second time interval, resetting the voltage on the gate of the first FET;

during a third time interval, charging the gate capacitance of the first FET with a current essentially equal to the drain current of the first FET; and resetting the voltage on the gate of the first FET when the voltage on the gate of the first FET is at least approximately equal to a reference voltage.

16. A clock signal generation method comprising the method of generating a signal according to claim 12, and further comprising determining timing of a clock signal in dependence on a current, which flows through a resistive element and to or from the capacitance.

17. A ramp signal generation method comprising the method of generating a signal according to claim 12, and further comprising varying the ramp signal with time in dependence on voltage on the capacitance.

18. A method of trimming the temperature coefficient of a signal comprising the method of generating a signal according to claim 12, wherein:

said first voltage is at least approximately proportional to said reference voltage according to a first constant of proportionality; and said second voltage is at least approximately proportional to temperature according to a second constant of proportionality, further comprising:

adjusting at least one of said first and second constants of proportionality.

19. An apparatus for generating a time-varying signal, comprising:

means for generating a current through the drain of a first field effect transistor having a gate, a drain and a source;

means for supplying to or from a capacitance a current matched to said current through the drain; and means for providing a bias voltage to the gate of the first field effect transistor;

means for generating the bias voltage at least approximately equal to a sum of a first voltage and a second voltage, the first voltage being at least approximately proportional to a reference voltage and the second voltage being at least approximately proportional to temperature; and means for controlling the voltage between the source and gate of the first field effect transistor to be at least approximately equal to the sum of the bias voltage and a gate threshold voltage of the first field effect transistor by summing the bias voltage and a further voltage at least approximately equal to a gate threshold voltage of the first field effect transistor to determine the voltage between the source and gate of the first field effect transistor, wherein the capacitance per unit area of the capacitance and the capacitance per unit area of the gate of the first field effect transistor are matched, and wherein the apparatus is arranged to control a time period of the time-varying signal dependent on the current to or from the capacitance.

20. An apparatus for generating a clock signal, comprising the apparatus of claim 19 and further comprising means for determining timing of a clock signal in dependence on a current, which flows through a resistive element and to or from the capacitance.

21. An apparatus for generating a ramp signal, comprising the apparatus of claim 19 and further comprising means for varying the ramp signal with time in dependence on voltage on the capacitance.

22. An apparatus for trimming the temperature coefficient of a signal comprising the apparatus of claim 19, and further comprising:

means for performing said generating the first voltage that is at least approximately proportional to said reference voltage according to a first constant of proportionality;

means for performing said generating the second voltage that is at least approximately proportional to temperature according to a second constant of proportionality; and means for adjusting at least one of said first and second constants of proportionality.

23. The apparatus for generating a signal according to claim 19, further comprising:

means for controlling said supply of current to or from the first capacitance, in dependence on the voltage on a second capacitance;

means for charging the second capacitance, during a first time interval, with a current at least approximately equal to the drain current of the first FET;

means for resetting the voltage on the gate of the first FET during a second time interval;

means for charging the gate capacitance of the first FET, during a third time interval, with a current essentially equal to the drain current of the first FET; and means for resetting the voltage on the gate of the first FET when the voltage on the gate of the first FET is at least approximately equal to a reference voltage.

* * * * *